US006636165B2

(12) United States Patent
Freidhof

(10) Patent No.: US 6,636,165 B2
(45) Date of Patent: Oct. 21, 2003

(54) DEVICE AND METHOD FOR CONVERSION OF SAMPLING RATE

(75) Inventor: Markus Freidhof, Taufkirchen (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 0 days.

(21) Appl. No.: 10/062,134

(22) Filed: Feb. 1, 2002

(65) Prior Publication Data

US 2002/0105448 A1 Aug. 8, 2002

(30) Foreign Application Priority Data

Feb. 6, 2001 (DE) ......................................... 101 05 255

(51) Int. Cl.$^7$ ............................................... H03M 7/00
(52) U.S. Cl. ......................................... 341/61; 341/123
(58) Field of Search ............................. 341/61, 118, 120

(56) References Cited

U.S. PATENT DOCUMENTS

| 5,365,468 A | | 11/1994 | Kakubo et al. |
| 5,451,944 A | * | 9/1995 | Sogo ............................ 341/61 |
| 5,617,088 A | | 4/1997 | Yasuda |
| 6,057,789 A | | 5/2000 | Lin |
| 6,518,894 B2 | * | 2/2003 | Freidhof ....................... 341/61 |

FOREIGN PATENT DOCUMENTS

EP          0 665 546 A2    8/1995

* cited by examiner

*Primary Examiner*—Peguy JeanPierre
*Assistant Examiner*—Joseph Lauture
(74) *Attorney, Agent, or Firm*—Harness, Dickey & Pierce, P.L.C.

(57) ABSTRACT

A resampler is used to convert an input digital signal sequence having an input sampling rate into an output digital signal sequence having an output sampling rate ($f_{out}$). An estimating unit estimates the sampling rate ratio between the input sampling rate and the output sampling rate ($f_{out}$) and estimates the set point phase of the output signal sequence in observation intervals whose observation length is variable. A controlling system compares the actual phase of the output signal sequence with the set point phase and generates a control signal ($R_{TC,k}$) as a function of the estimated sampling rate ratio and the deviation of the actual phase from the set point phase. An interpolator interpolates the input signal sequence for generating the output signal sequence at sampling times whose location in time is predetermined by the control signal ($R_{TC,k}$).

19 Claims, 5 Drawing Sheets

Stand der Technik

DEVICE AND METHOD FOR CONVERSION OF SAMPLING RATE

This application claims priority to German Patent Application 101 05 255.3, filed Feb. 6, 2001, the entire contents of which are hereby incorporated by reference.

BACKGROUND OF THE INVENTION

1. Field of the Invention

The present invention generally relates to a device for converting an input digital signal sequence having an input sampling rate into an output digital signal sequence having an output sampling rate which differs from the input sampling rate. Such a device is generally known as a resampler. The present invention also relates to a method of this type.

2. Related Art

Such a resampler is known from European Patent Application 0 665 546 A2, for example. With a resampler, the ratio of the input sampling rate to the output sampling rate must first be determined. In the publication indicated above, this is performed by a gate time measurement. In an interpolator, samples at the output sampling times predetermined by the output sampling rate are interpolated from the samples of the input signal sequence. The interpolator is controlled by the sampling rate ratio detected. Since the determination of the sampling rate ratio is subject to measurement inaccuracies, buffering is provided in a buffer memory, e.g., a FIFO, at the output of the interpolator in the case of down-sampling and at the input of the interpolator in the case of up-sampling. According to the European Patent Application 0 665 546 A2, the sampling rate ratio controlling the interpolator is regulated as a function of the filling level of the buffer memory.

Regulation of the sampling rate ratio (ratio) as a function of the filling level of the buffer memory as proposed in the European Patent Application 0 665 546 A2 has the disadvantage that when there is a change in the filling level of the buffer memory, the group propagation time of the digital signal is altered by the resampler. When used in mobile wireless technology, for example, major changes in filling level of the buffer memory of ±1, for example, i.e., a change by one memory unit, cannot be tolerated because they would lead to fluctuations in signal propagation time through the resampler. In the case of the filling level controller of the buffer memory proposed in European Patent Application 0 665 546 A2, deviations in clock rate ratio are detected relatively late, if there has already been a relatively great detuning of the ratio. This leads to major interpolation errors due to incorrect sampling times.

A resampler with phase estimation but without any observation intervals having a variable observation length is known from German Patent Application 101 02 166 A1, which was published later.

SUMMARY OF THE INVENTION

An object of the present invention is to provide a device (resampler) and a method (resampling method) for converting an input digital signal sequence having an input sampling rate into an output digital signal sequence having an output sampling rate which operates with a high precision and with which a short acquisition time is sufficient.

This object, and other objects of the present invention, is achieved by the features of claim 1 with regard to the device and by the features of claim 11 with regard to the method. The dependent claims contain advantageous embodiments of the device and the method.

The present invention is based on the finding that accuracy in control of the interpolator or in establishment of the sampling times of the output signal sequence can be increased considerably if the control is based not only on an estimate of the sampling rate ratio but also on an estimate of the phase angle with observation intervals of variable length. Through the phase-coherent control according to the present invention, a deviation in the sampling rate ratio is detected before the deviation becomes so great that it leads to an increase or decrease in the storage level in the buffer memory (FIFO). This prevents a significant change in group propagation time through the resampler, which is associated with a change in memory level, and increases the interpolation accuracy of the interpolator. At the start of operation, observation intervals may be kept relatively short to achieve a short acquisition time. Accuracy can be increased through a subsequent incremental increase in observation length.

BRIEF DESCRIPTION OF THE DRAWINGS

An embodiment of the resampler according to this invention and the resampling method according to this invention is described in greater detail below with reference to the drawings, which illustrate.

DETAILED DESCRIPTION OF THE PREFERRED EMBODIMENTS

Figure 1:
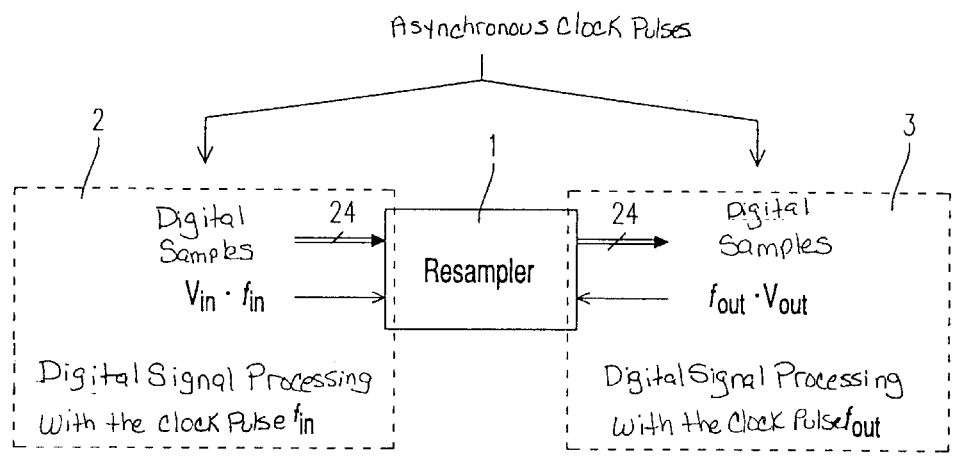
FIG. 1 illustrates a schematic diagram of a resampler.

FIG. 1 illustrates the basic principle of a resampler 1 on which the present invention is based. The resampler 1 is connected to a first digital signal processor 2 which works with a clock pulse $f_{in}$ and to a second digital signal processor 3 which works with a clock pulse $f_{out}$. The first digital signal processor 2 generates digital samples, e.g., with a width of 24 bits, which are sent to the resampler 1. Furthermore, the clock pulse $V_{in} \cdot f_{in}$ of the first digital signal processor 2 and the clock pulse $V_{out} \cdot f_{out}$ of the second digital signal processor 3 are also sent to the resampler (sample rate converter), where $V_{in}$ and $V_{out}$ are integral multiples and may preferably be equal to 1. The clock pulses $f_{in}$ and $f_{out}$ are generally asynchronous and may be in any desired ratio to one another, but not generally an integral ratio. The resampler 1 has the function of converting digital samples of the first digital signal processor 2, which operates with the clock pulse $f_{in}$, into digital samples of the second digital signal processor 3, which operates with the clock pulse $f_{out}$. For the case when $f_{out}$ is less than $f_{in}$, this is called down-sampling. For the case when $f_{out}$ is greater than $f_{in}$, it is called up-sampling.

Figure 2:
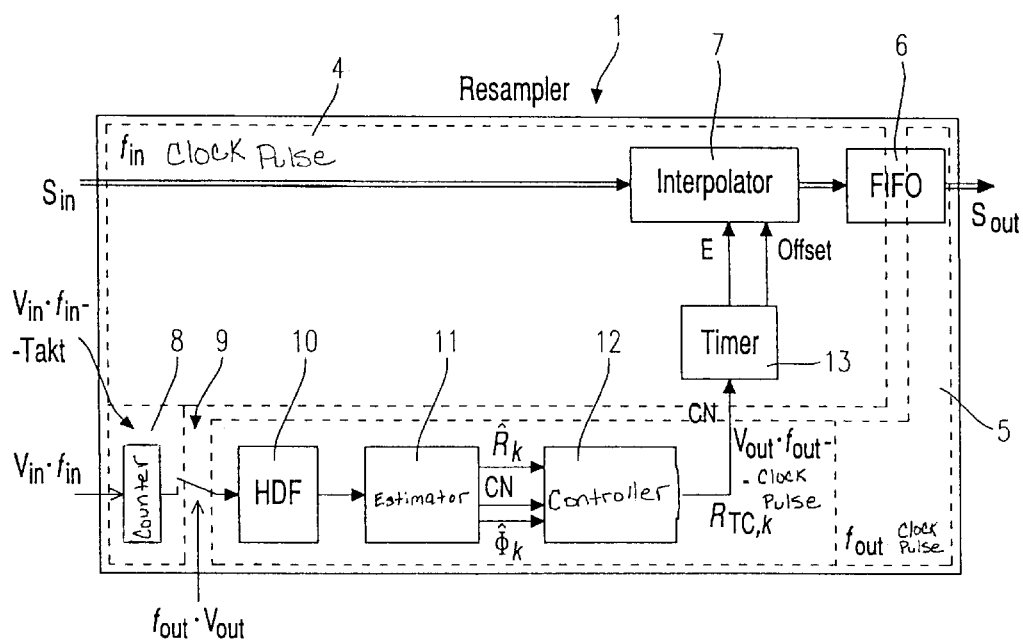
FIG. 2 illustrates a block diagram of a resampler according to the present invention.
Figure 8:
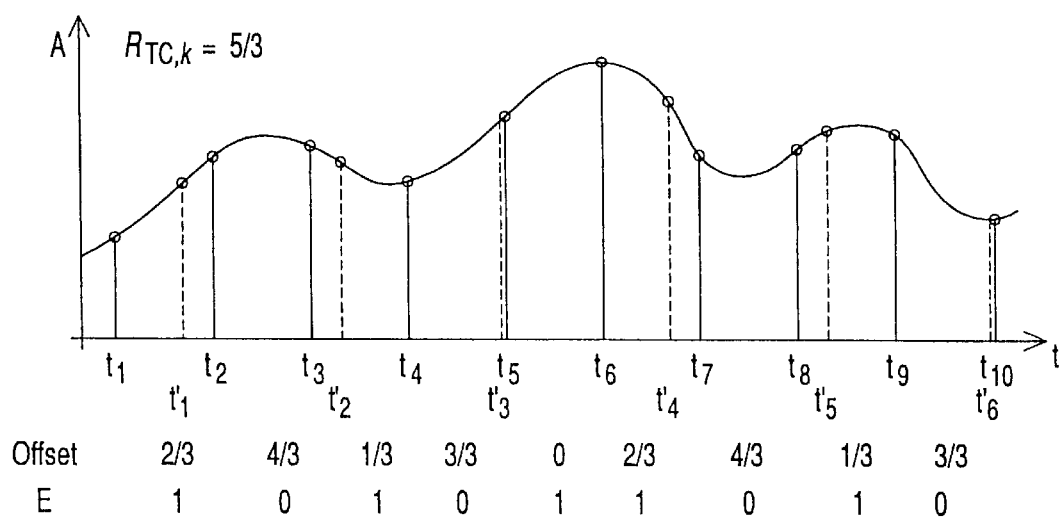
FIG. 8 illustrates a diagram to illustrate the functioning of the time control unit illustrated in FIG. 4.

FIG. 2 illustrates an embodiment of a resampler 1 according to the present invention. This illustrates the case of down-sampling. A first block 4 of resampler 1 works with an input clock pulse $f_{in}$ while a second block 5 of resampler 1 works with an output clock pulse $f_{out}$. The input digital signal sequence $S_{in}$ sent to resampler 1 is sent to an interpolator 7 with the clock pulse $f_{in}$. An interpolation is performed in interpolator 7 to generate the samples of output signal sequence $S_{out}$ at sampling times which correspond to the output sampling rate $f_{out}$. This is illustrated in FIG. 8. Samples A at sampling times $t_1, t_3, \ldots, t_{10}$ correspond to the input signal sequence $S_{in}$, while samples A at sampling times $t'_1, t'_2, \ldots, t'_6$ correspond to the output signal sequence $S_{out}$.

In the case of down-sampling illustrated here, a buffer memory 6 is connected downstream from the interpolator 7; furthermore, in the embodiment illustrated here, the buffer memory is designed as a FIFO (first-in first-out) memory. During a transient recovery phase in particular, the buffer memory 6 serves to provide buffer storage of samples which are generated by the interpolator 7 and are picked up at the output of the buffer memory 6 with the clock pulse $f_{out}$. One goal of the present invention is to keep the filling level of buffer memory 6 exactly constant and to prevent fluctuations in the filling level of buffer memory 6. Therefore, interpolator 7 is not controlled on the basis of a filling level detection performed on buffer memory 6, as in the conventional art, because such a control could not intervene until there is a change of at least 1 in the filling level of buffer memory 6. Instead of being based on an estimate of the sampling rate ratio $R=f_{in}/f_{out}$, the control according to the present invention is instead based on an additional estimate of the phase angle Φ of the output sampling rate $f_{out}$ with respect to the input sampling rate $f_{in}$.

To determine the sampling rate ratio (ratio) R, the input sampling rate $f_{in}$ is sent to a counter 8 whose output is sampled by a sampling element 9 with the output sampling rate $f_{out}$. The signal generated in this way passes through a first-order cascaded-integrated comb filter (CIC filter) 10 in this embodiment. An estimator 11 for estimating the sampling rate ratio R and the phase angle Φ is connected downstream from this CIC filter 10. The estimator 11 analyzes N samples in each case and generates an estimate $R_k$ at the end of such an observation interval with the observation length N for sampling rate ratio $f_{in}/f_{out}$ and for the phase $\Phi_k$ of the phase angle of the output clock pulse $f_{out}$. These estimates are sent to a control unit 12 which generates a control signal $R_{TC,k}$ from them. This control signal $R_{TC,k}$ is sent to a time control unit 13 which generates a time offset signal (offset), which characterizes the sampling times $t'_1, t'_2, \ldots, t'_6$ of the output signal sequence $S_{out}$ with respect to the sampling times $t_1, t_3, \ldots, t_{10}$ of the input signal sequence $S_{in}$, and also generates an indicator signal E which characterizes whether or not a sampling time of the output signal sequence $S_{out}$ is within a certain sampling interval of the input signal sequence $S_{in}$. According to the present invention, the observation length N of the observation intervals is variable.

The individual elements of the resampler 1 according to the present invention, as illustrated in FIG. 2, are described in detail below.

Figure 3:
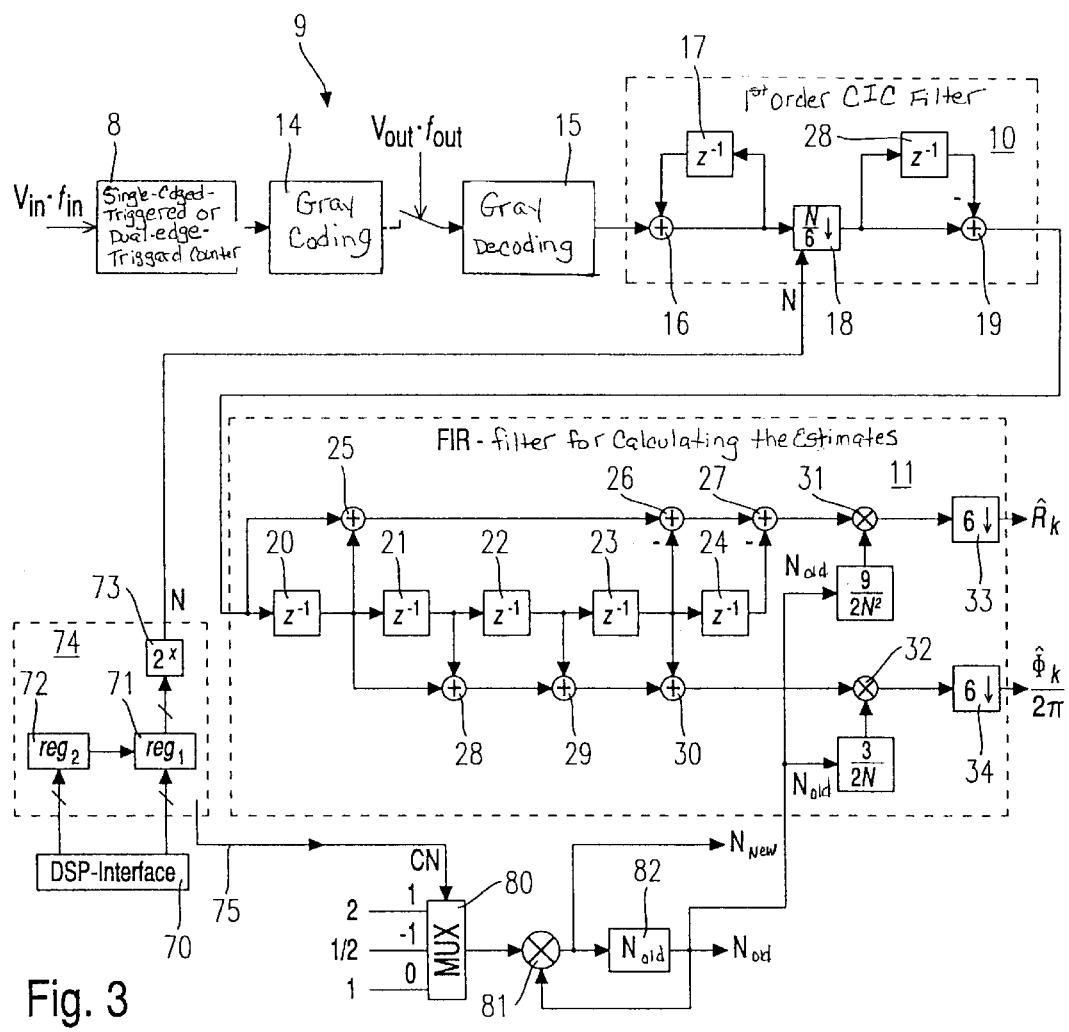
FIG. 3 illustrates a block diagram of a detailed section of the resampler, according to the present invention, for determining the sampling rate ratio and the phase angle.

FIG. 3 illustrates a block diagram of the elements for generating the sampling rate ratio (ratio) R of the CIC filter 10 and the estimator 11.

In the case of down-sampling illustrated in FIG. 2, the input sampling rate $f_{in}$ is sent to counter 8, which may be designed as a single-edge-triggered counter or as a dual-edge-triggered counter. The count values of counter 8 are sent to a Gray coder 14, which performs Gray coding on the count values. In Gray coding, only one bit changes in both incrementing and decrementing. The error in the subsequent sampling with output sampling rate $f_{out}$ in sampling element 9 therefore amounts to a maximum of one bit. Gray coding is then reversed in the downstream Gray decoder 15. Gray coder 14 and Gray decoder 15 are optional and may be omitted. The sampling rate ratio (ratio) may also be determined by a method other than that using counter sampling. The functions of $f_{in}$ and $f_{out}$ are reversed in up-sampling.

In the embodiment illustrated here, the output signal of the Gray decoder 15 is sent to a first-order CIC filter 10. Samples are added up continuously in a first stage by way of an adder 16 and a time-delay element 17. In this embodiment, the sampling rate is reduced by a factor of 6 in a sample converter 18, i.e., only every N/6-th value of the output of adder 16 is selected for further processing, and N/6−1 values are omitted in between. In a second stage including a subtractor 19 and a time-delay element 28, the initial value is subtracted from the final value of a block of the length N/6, i.e., the values at the output of the CIC filter 10 represent the block-by-block sum of N/6 samples. These block-by-block sum values are sent to estimator 11. Variable observation length N represents the length of the observation interval of the estimator 11.

Estimator 11 includes a chain of several time-delay elements 20, 21, 22, 23 and 24. Selected initial values, intermediate values and final values of this delay chain 20–24 are sent to adders 25, 26 and 27 for calculation of estimates for the sampling rate ratio and to other adders 28, 29 and 30 for calculation of estimates for the phase. In multiplying units 31 and 32, a suitable standardization is performed with standardization factor $9/2N^2$ for the sampling rate ratio and $3/2N$ for the phase before the sampling rate is reduced by the remaining value 6 in a sample converter 33 or 34, so that an estimate $R_k$ for the sampling rate ratio (ratio) and an estimate standardized to 2π for the phase $\Phi_k/2\pi$ are each available at the output of estimator 11 after an observation interval having N input values.

The exact functionality of the estimator in FIG. 3 is described in detail in German Patent Application 100 39 666 A1 by the same applicant and the same inventor. The full content of this German Patent Application 100 39 666 A1 is herewith included in the present patent application.

Variation of observation length N of the observation interval is described below. Resampler 1 is connected over a DSP interface 70 to a digital signal processor DSP. The DSP interface 70 is connected to a first register 71 and a second register 72. The current observation length N is obtained from content $reg_1$ of the first register 71. In the embodiment shown here, the register content $reg_1$ is the power of two, which yields observation length N. Thus $N=3\cdot2^{x+1}$, where $x=reg_1$. Imaging of the register contents $reg_1$ on the current observation length N takes place in an exponent-forming unit 73.

The observation length N may be either increased or decreased by a factor of two in increments in this embodiment. If the digital signal processor DSP sends a command for multiple doubling of the current observation length N, a positive register content $reg_2$ is entered into the second register 72. If the digital signal processor DSP sends a command for multiple halving of the current observation length N, then a negative content $reg_2$ is entered into the second register 72. Content $reg_2$ of the second register 72 indicates how often the current observation length N is to be doubled or reduced by one half. The observation length is kept constant for six blocks of the length N/6, so that the registers of time-delay elements 20–24 have contents belonging to a uniform observation length N. After six blocks of the length N/6, the observation length can either be doubled or reduced by one half. If it is doubled, content $reg_1$ of the first register 71 is incremented and content $reg_2$ of the second register 72 is decremented. In the case when it is reduced by one half, content $reg_1$ of the first register 71 is decremented, and content $reg_2$ of the second register 72 is incremented.

From the observation length N thus generated, the pulse duty factor N/6 may be obtained for the sample converter 18 and standardization factors $9/2N^2$ and $3/2N$ for multiplying units 31 and 32, which may also be designed as bit shifters. Furthermore, a control signal CN is generated by the observation length control 74 on a control line 75. Control signal CN marks the estimate for the sampling rate ratio $R_k$ or the estimate of the standardized phase $\Phi_k/2\pi$ which represents the last estimate determined with the old observation length. In the embodiment illustrated here, control signal CN=0 when the observation length N remains the same, and CN=1 when the observation length N is doubled and CN=–1 when the observation length N is reduced by half. The observation length control 74 is connected over control line 75 with the controlling system 12 to be described in greater detail below on the basis of FIG. 5.

The control signal CN is sent to a switching device 80. An input value 2, ½ and 1 are applied at the inputs of the switching device (multiplexer MUX). If the control signal CN=1, then the output of the switching device 80 receives the value 2; if the control signal CN=–1, the output of switching device 80 receives the value ½; and if the control signal CN=0, the output of switching device 80 receives the value 1. The output of switching device 80 is connected to a multiplying unit 81. The other input of multiplying unit 81 is connected to the output of a register 82. At the start of operation of resampler 1, a starting value for the observation length is entered. With each clock cycle of the circuit, the content of register 82 is replaced by accepting the value at the input of the register. As long as control signal CN=0, and thus there is no change in the observation length, the output of switching device 80 is 1 and thus the starting value $N_{old}$ of the observation length N is unchanged. If the observation length is to be doubled, the control signal CN+2 and the value $N_{new}$ at the output of multiplying unit 81 is twice as large as the preceding value $N_{old}$ for the observation length. The new value for the observation length $N_{new}$ is available at the input of register 82, while the old value of the observation length $N_{old}$ is available at the output of register 82 and can be used for calculating the standardization factors $9/(2\cdot N^2)$ and $3/(2\cdot N)$. The values $N_{new}$ and $N_{old}$ are sent together with control signal CN to other circuit components, such as the controlling system 12 shown in FIG. 5. Control signal CN is also sent to the time control unit 13 shown in FIG. 4.

Figure 4:
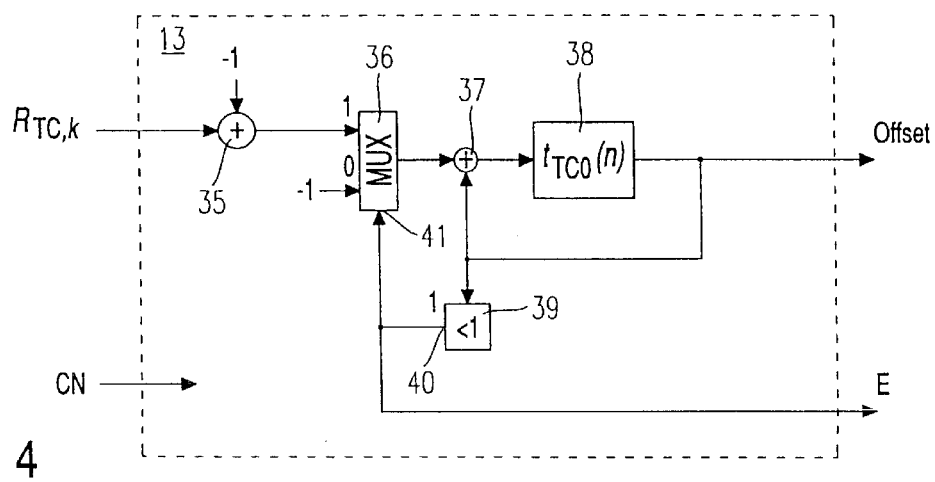
FIG. 4 illustrates a block diagram of the time control unit of the resampler according to the present invention.

FIG. 4 illustrates a block diagram of the time control unit 13. Controlling system 12 generates a control signal $R_{TC,k}$ from the estimates of the sampling rate ratio $R_k$ and the estimates of the phase $\Phi_k$ by a method to be described in greater detail on the basis of FIG. 5, and this control signal $R_{TC,k}$ is sent to the time control unit 13. In an adder 35, the control signal $R_{TC,k}$ is reduced by 1. The function of time control unit 13 is to send interpolator 7 a time offset signal (offset) which characterizes the sampling times $t'_1, t'_2, \ldots, t'_6$ of the output signal sequence $S_{out}$ with respect to sampling times $t_1, t_3, \ldots, t_{10}$ of the input signal sequence $S_{in}$. The sampling period of the input signal sequence $S_{in}$ in this embodiment is standardized to 1. In another standardization, instead of 1, the corresponding standardization quantity would be subtracted. Furthermore, an indicator signal E is generated by control 13, indicating to interpolator 7 whether a sampling time of the output signal sequence $S_{out}$ occurs in the next following sampling period of the input signal sequence $S_{in}$.

The output of adder 35 is connected to a switching device (multiplexer MUX) 36. When switching device 36 receives a logic "1" at its switch input 41, it connects its output to adder 35. Otherwise, its output is connected to the other input at which the value –1 is applied continuously. The output of switching device 36 is connected to an adder 37. The output of adder 37 is connected to a time-delay element 38 which shifts the digital values by one sampling period $t_{TC0}(n)$, e.g., $t_2-t_1$, of the input signal sequence $S_{in}$. The output of the time-delay element 38 is connected to the second input of the adder 37 and to a detector 39. The detector 39 ascertains whether the current output value of the time-delay element 38 is greater than or less than 1. If the current output value of the time-delay element 38 is less than 1, the detector 39 generates a logic "1" at its output 40, otherwise a logic "0." If the current output value of time-delay element 38 (register) is less than 1, the input of adder 37 receives the value $R_{TC,k}$–1; otherwise, the input of adder 37 receives the value –1 over switching device 36. Output values of time-delay element 38 form the time offset signal (offset), while output values of detector 39 form indicator signal E.

The functioning of time control unit 13 illustrated in FIG. 4 and that of interpolator 7 are described below with reference to FIG. 8. FIG. 8 illustrates a signal with an amplitude A, which is sampled at sampling times $t_1, t_2, t_3, t_4, t_5, t_6, t_7, t_8, t_9$ and $t_{10}$ according to input signal sequence $S_{in}$. After resampling in resampler 1, the signal is sampled at sampling times $t'_1, t'_2, t'_3, t'_4, t'_5$ and $t'_6$. The position in time of the sampling times $t'_1, t'_2, \ldots t'_6$ of output signal sequence $S_{out}$ with respect to sampling times $t_1, t_2, \ldots t_{10}$ of input signal sequence $S_{in}$ is sent to interpolator 7 by time control unit 13 by way of the time offset signal (offset) and the indicator signal E.

In the example illustrated in FIG. 8, it is assumed that control signal $R_{TC,k}$=5/3. Control signal $R_{TC,k}$ is essentially the sampling rate ratio $R=f_{in}/f_{out}$, although the latter is regulated according to the present invention on the basis of the phase estimate in a manner to be described in greater detail below on the basis of FIGS. 5 through 7. It is also assumed that the starting value in time-delay element (register) 38 for time offset signal (offset)=2/3. Since 2/3<1, indicator signal E=1. For interpolator 7, this means that a sample of output signal sequence $S_{out}$ must be generated by interpolation at a sampling time $t'_1$, which is 2/3 of the sampling period of the input signal sequence $S_{in}$ after sampling time $t_1$.

The switching device 36 connects the input of adder 37 to adder 35, so that the value $R_{TC,k}$–1=2/3 is added to the register status of the time-delay element (register) 38, and then the value offset=4/3 appears at the output of the time-delay element (register) 38. Since 4/3>1, the output of detector 39 is now "0" and interpolator 7 does not perform any interpolation between $t_2$ and $t_3$ because of this status of indicator signal E. In the following clock pulse, the input of adder 37 receives –1 because of logic state "0" of the output of detector 39, and the signal offset at the output of the time-delay element (register) 38 becomes offset=1/3. Since 1/3<1, indicator signal E=1. The interpolator 7 thus performs an interpolation at a position after time $t_3$ which has been shifted by 1/3 of the sampling period of input signal sequence $S_{in}$, i.e., to the position $t_2$ in FIG. 8, for generating the next value of output signal sequence $S_{out}$.

In the next clock pulse, the adder 37 again receives the value $R_{TC,k}-1=2/3$, so that the output of the time-delay element (register) assumes the value 3/3=1. The output of detector 39 is thus "0" and indicator signal E=0, so that no interpolation is performed between times $t_4$ and $t_5$. In the next clock pulse, the input of adder 37 receives −1 and the output of the time-delay element (register) 38 becomes 0. Since indicator signal E is set at "1" by detector 39, the next interpolation is thus performed at time $t'_3=t_5$. This series can be continued as indicated in FIG. 8. Control signals $R_{TC,k}$ are used in time control unit 13 at CN=0, to generate $N/V_{out}$ output values, at CN=1, to generate $N_{new}/V_{out}+N_{new}/(2m\cdot V_{out})$ output values, and at CN=−1, to generate $N_{new}/V_{out}-N_{old}/(2m\cdot V_{out})$ output values.

The function and structure of one embodiment of the controlling system 12 are described in greater detail below on the basis of FIGS. 5 through 7.

Figure 5:
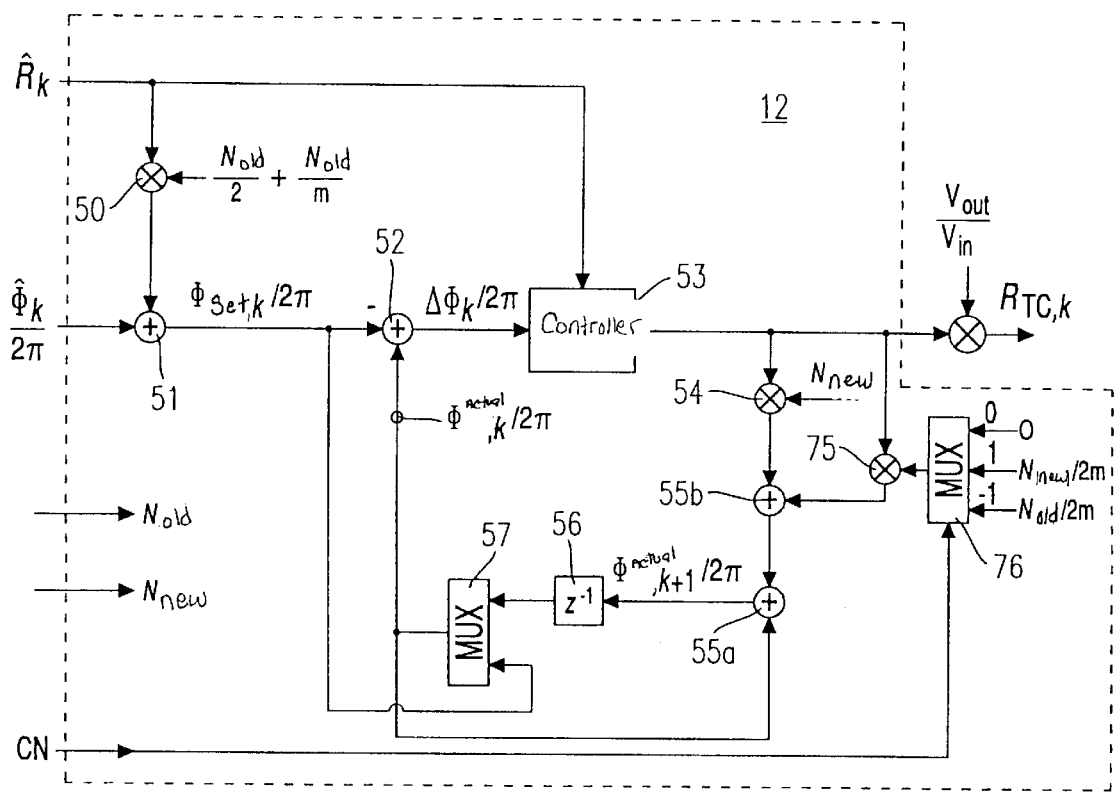
FIG. 5 illustrates a block diagram of a controlling system of the resampler according to the present invention.

FIG. 5 shows one embodiment of the controlling system 12. After each observation interval, controlling system 12 receives an estimate for the sampling rate ratio $R_k$ and an estimate standardized to $2\pi$ for the phase $\Phi_k/2\pi$. Index k indicates the observation intervals illustrated in FIG. 7. In the example illustrated in FIG. 7, each observation interval includes six samples in the clock pulse $f_{out}$ of output signal sequence $S_{out}$. In the embodiment of estimator device 11 illustrated in FIG. 3, the estimation is performed in the middle of each observation interval. For control purposes, however, an estimate is needed at the beginning of the next observation interval. Therefore, a phase offset of $(N_{old}/2)\cdot R_k$ is added to estimate $\Phi_k/2\pi$, as illustrated in the middle row in FIG. 7. When observation length N is variable, $N_{old}$ stands for the observation length before the change, while $N_{new}$ stands for the observation length after the change.

In the embodiment illustrated in FIG. 5, an additional phase offset of $(N_{old}/m)\cdot R_k$ is added, where m may be m=12, for example. This additional offset serves to ensure that the resulting set point phase $\Phi_{set,k}$ will not occur before the start of the next observation interval even in the case of the greatest possible controller deviation to be expected. In the embodiment described here, the phase shift described above is formed by a multiplying unit 50, which may also be implemented as a bit-shift operation (bit shifter) with a suitable choice of the phase shift, and an adder 51.

At the beginning of the next observation interval, the phase $\Phi_{set,k}/2\pi$ standardized to $2\pi$ is compared with the actual phase $\Phi_{actual,k}/2\pi$ standardized to $2\pi$. The deviation $\Delta\Phi_k/2\pi$ is determined in a subtractor 52 and sent to a controller 53. Furthermore, estimates for the sampling rate ratio $R_k$ are also sent to the controller 53. The controller 53 operates so that control signal $R_{TC,k}$ formed at the output of the controller 53 corresponds essentially to the sampling rate ratio $R_k$ estimated in the previous observation interval, but it is modified so slightly, based on controlled variable $\Delta\Phi_k/2\pi$, that through the control signal $R_{TC,k}$ the result achieved is that the actual phase $\Phi_{actual,k}$ at the end of the observation interval to be regulated corresponds to the set point phase $N_{set,k}$. In the steady state of the controller, $R_k$ ideally corresponds to the control signal $R_{TC,k}$.

The actual phase $\Phi_{actual,k}$ of the output signal sequence $S_{out}$ standardized to $2\pi$ is formed so that control signal $R_{TC,k}$ representing the sampling rate ratio used in fact by the time control unit 13 is multiplied by the observation length $N_{new}$ in a multiplying unit 54. Here again, multiplying unit 54 may be replaced by a bit shift operation (bit shifter) to avoid actual multiplication. In this way, the phase shift during the k-th observation interval is determined and sent to adder 55b whose output is connected via another adder 55a to a time-delay element 56 (register) which performs a shift by the length of an observation interval in each case. Except in initialization, which is to be described below, the switching device 57 is always connected so that its output is connected to time-delay element 56. Consequently, the output of the time-delay element 56 is sent back to one of the inputs of the adder 55a. The output of the time-delay element (register) 56 represents the actual phase $\Phi_{actual,k}$ at the beginning of the k-th use interval, so the actual phase $N_{actual,k}$ at the beginning of the (k+1)-th use interval $\Phi_{actual,k+1}/2\pi$ is calculated by adding the phase $\Phi_{actual,k}$ at the beginning of the k-th use interval and the phase shift brought about in the k-th observation interval. Thus, the actual phase is updated continuously, taking into account the phase shift occurring in the respective current use interval.

To be able to compensate for the change in interval between the observation interval and the respective use interval in which a certain value $R_{TC,k}$ is used, in doubling the observation length N or reducing it by one half, another multiplying unit 75 is provided, connecting the output of controller 53 to one of the inputs of adder 55b.

The interval between the end of the observation interval and the beginning of the respective use interval is N/m. With a change in observation length, time control unit 13 uses ratio $R_{TC,k}$ for a longer or shorter period of time. This must be taken into account in calculation of $\Phi_{actual,k}$.

For the case when no change is made in observation length N, and thus control signal CN=0, a multiplier of 0 is sent to multiplying unit 75 over the switching device (multiplexer MUX) 76. When the observation length N is doubled, and thus control signal CN=1, multiplier $N_{new}/2m$ is sent to multiplying unit 75. However, if the observation length N is reduced by one half, and thus control signal CN=−1, the multiplier $-N_{old}/2m$ is sent to multiplying unit 75. These relationships are illustrated in FIGS. 9A and 9B.

Figure 9A:
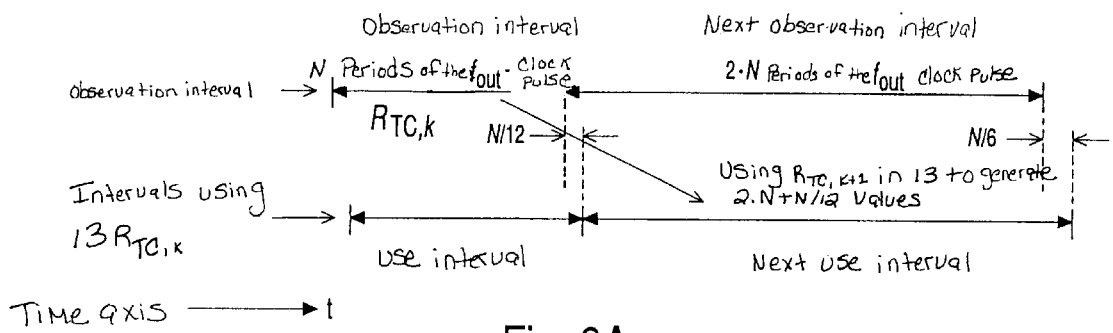
FIG. 9A illustrates a diagram to illustrate doubling the observation length.
Figure 9B:
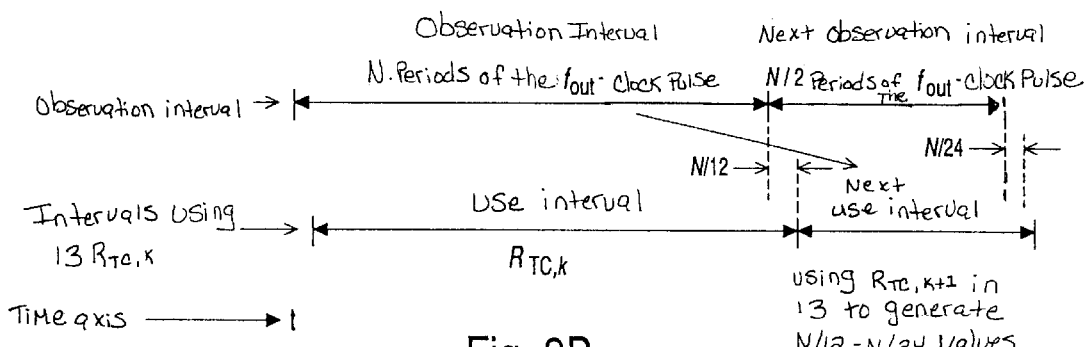
FIG. 9B illustrates a diagram to illustrate halving the observation length.

FIG. 9A illustrates the case when the observation length N is doubled. In the example shown here, m=12. An observation interval consisting of N periods of the $f_{out}$ clock pulse is followed by a next observation interval consisting of 2N periods of the $f_{out}$ clock pulse. Accordingly, a use interval shifted by the offset N/12 in comparison with the observation interval is followed by a next use interval in which the estimates from the observation interval shown at the left of the first row in FIG. 9A are used. This use interval begins N/12 after the respective observation interval but only ends N/6 after the next observation interval. This use interval has the length:

$$2\cdot N_{old}+N_{old}/12=N_{new}+N_{new}/24$$

where $N_{new}=2\cdot N_{old}$.

FIG. 9B illustrates the relationships when the observation length N is reduced by half. The use interval begins here after reducing the observation length N/12 by half after the respective observation interval and ends N/24 after the next observation interval. Consequently, this use interval has the following length:

$$N_{old}/2-N_{old}/24=N_{new}-N_{old}/24$$

where $N_{new}=2\cdot N_{old}$.

FIG. 5 illustrates the corresponding implementation of this shift in the use interval to be taken into account. As long as the observation length N does not change, the length of the use interval is always $N_{new}=N_{old}$. If the observation length N is doubled, the additional phase offset $N_{new}/2m \cdot R_{TC,k}$ must also be added. However, if the observation length is reduced by one half, then the additional phase offset $N_{old}/2m \cdot R_{TC,k}$ must be subtracted.

At the beginning of control, the actual phase is not known. Therefore, the output of the adder 51 is connected to the + input of the subtractor 52 at the beginning of control in initialization over the switching device (multiplexer MUX) 57, so that because of the identity of the input signals of the subtractor 52, the controlled variable $\Delta\Phi_k/2\pi$ is at first 0.

Figure 6:
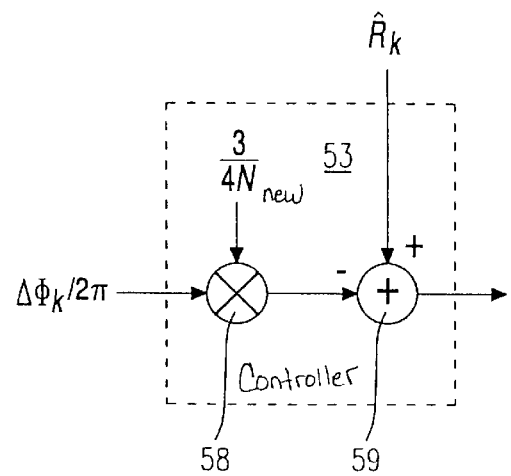
FIG. 6 illustrates a more detailed diagram of the controller of the controlling system illustrated in FIG. 5.

FIG. 6 illustrates an embodiment of controller 53. In this embodiment, the controller 53 is designed as a proportional controller, i.e., the change in the estimated sampling rate ratio $R_k$ is proportional to controlled variable $\Delta\Phi_k/2\pi$, with the proportionality factor being 3/4N in the embodiment illustrated here. The proportionality factor and the controlled variable $\Delta\Phi_k/2\pi$ are sent to a multiplier 58 which may be implemented as a bit-shift operation (bit shifter) with a suitable choice of the proportionality factor. The actual control is accomplished by means of a subtractor 59, which receives the output of multiplier 58 and the estimates of the sampling rate ratio $R_k$.

Figure 7:
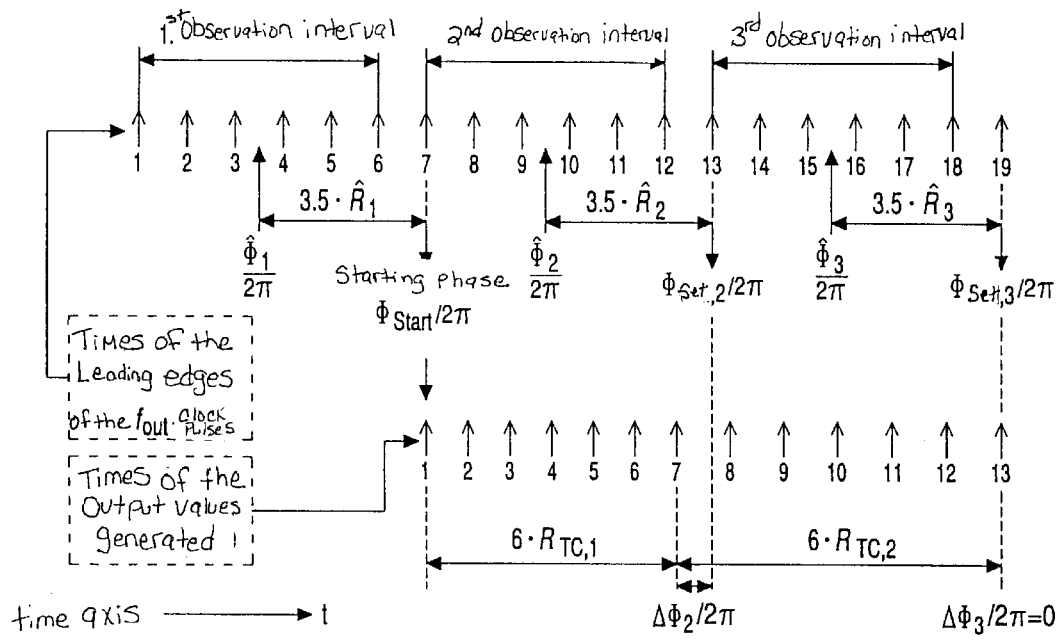
FIG. 7 illustrates a diagram to illustrate the functioning of the controlling system illustrated in FIG. 5.

The functionality of the controlling system 12 illustrated in FIG. 5 is explained in greater detail on the basis of FIG. 7. In the first row in FIG. 7, the sampling times of the output signal sequence $S_{out}$, represented by the leading edges of the $f_{out}$ clock pulse, for example, are illustrated by arrows. The second line indicates that the estimator 11 determines an estimate standardized to $2\pi$ for the phase $\Delta\Phi_k/2\pi$ for the middle of each observation interval. To obtain the phase of the output clock pulse $f_{out}$ at the beginning of the next observation interval, the phase in this example must be shifted by $3.5 \cdot R_k$ in each case. This yields the setpoint phase $\Phi_{set,k}$ at the beginning of the next observation interval.

Control can still be performed in the first observation interval, because the estimates $R_1$ and $\Phi_1$ are determined for the first time in this observation interval. In the second observation interval, the starting phase $\Phi_{start}/2\pi$ in which the actual phase of the controlling system 12 is initialized is determined by the switching device (multiplexer) 57. At the end of the second observation interval, controlled variable $\Delta\Phi_2/2\pi$, representing the deviation of the actual phase from the setpoint phase at the end of the second observation interval, can be determined for the first time. In the example illustrated in FIG. 7, clock pulse $f_{out}$ during the second observation interval was too large. Clock pulse $f_{out}$ is reduced during the third observation interval so that at the end of the third observation interval, the actual phase is ideally exactly the same as the setpoint phase.

Figure 10:
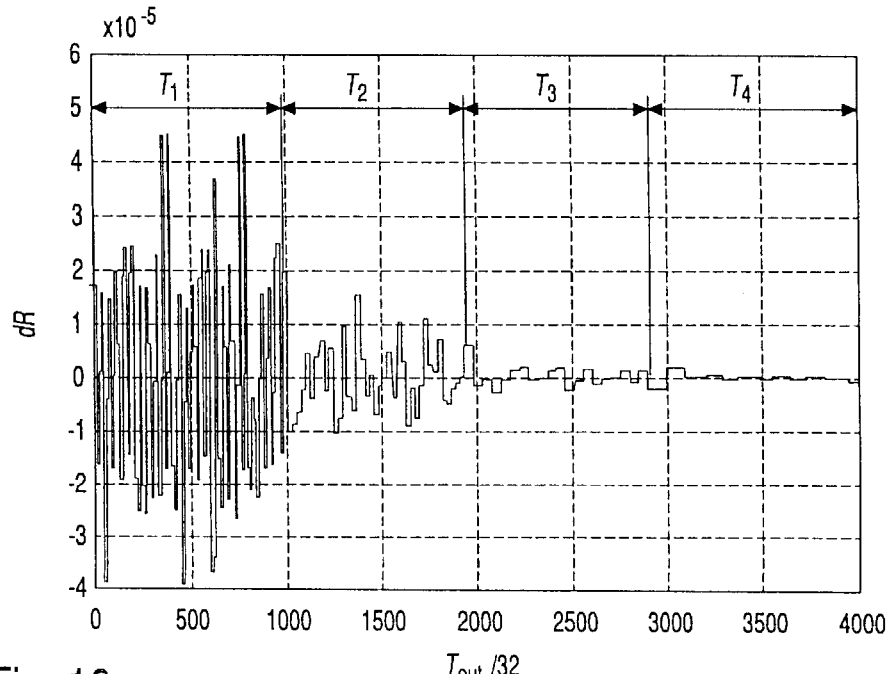
FIG. 10 illustrates a diagram to illustrate the relationship between the observation length and accuracy.

FIG. 10 illustrates the absolute change dR in the sampling rate ratio $R_k$ as a function of sampling times $T_{out}$ of the output signal sequence $S_{out}$. The observation interval is relatively short during an interval $T_1$. This can be seen by the relatively frequent changes in the sampling rate ratio $R_k$. In a following interval $T_2$, the observation length N is doubled in comparison with the interval $T_1$. In a following interval $T_3$ the observation length N is doubled again in comparison with interval $T_2$, while in an interval $T_4$ the observation length N is doubled once more in comparison with interval $T_3$. This shows again clearly the reduction in fluctuation and thus the error in the sampling rate ratio $R_k$ with an increase in the observation length N.

In starting operation of the resampler, it is advantageous to first use short observation lengths N to keep the acquisition time short. As illustrated in FIG. 7, the control is already operative during the third observation interval. To increase accuracy, the observation length N can then be doubled in steps, as illustrated in FIG. 10.

The present invention is not limited to the embodiment illustrated here. In particular, the estimator 11 may also be configured differently than that illustrated in FIG. 3. For the controlling system 12 and the time control unit 13, embodiments other than those shown in FIGS. 4 and 5 are also conceivable. The present invention may also be used for a resampler 1 in up-sampling operation, in which case then the functions $f_{in}$ and $f_{out}$ in FIG. 2 would be exchanged, and the buffer memory (FIFO) 6 would be arranged upstream from the interpolator 7.

The present invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A device for converting an input digital signal sequence ($S_{in}$) with an input sampling rate ($f_{in}$) into an output digital signal sequence ($S_{out}$) with an output sampling rate ($f_{out}$), comprising:
   an estimator which estimates a sampling rate ratio ($R_k$) between the input sampling rate ($f_{in}$) and the output sampling rate ($f_{out}$) and estimates a set point phase ($\Phi_{set,k}$) of the output signal sequence ($S_{out}$) in observation intervals being variable in observation length;
   a controlling system which is connected to the estimator and compares an actual phase ($\Phi_{actual,k}$) of the output signal sequence ($S_{out}$) with the set point phase ($\Phi_{set,k}$) of the output signal sequence ($S_{out}$) and generates a control signal ($R_{TC,k}$) as a function of the estimated sampling rate ratio ($R_k$) and a deviation ($\Delta\Phi_k$) of the actual phase ($\Phi_{actual,k}$) from the set point phase ($\Phi_{set,k}$); and
   an interpolator which interpolates the input signal sequence ($S_{in}$) for generating the output signal sequence ($S_{out}$) at sampling times ($t'_1, t'_2, \ldots, t'_6$), the sampling times ($t'_1, t'_2, \ldots, t'_6$) having a position in time being predetermined by the control signal ($R_{TC,k}$).

2. The device according to claim 1, wherein a first register whose content ($reg_1$) indicates a current observation length and a second register whose content ($reg_2$) indicating how often the current observation length is to be increased or decreased by a certain factor are provided in an observation length controller.

3. The device according to claim 2, wherein the estimator includes a standardization device for standardizing the estimate for the sampling rate ratio ($R_k$) and a phase ($\Phi_k$) with standardization factors ($9/2N^2$; $3/2N$) which depend on the current observation length.

4. The device according to claim 2, wherein a filter which is connected upstream from the estimator includes a sample converter which omits a number (N/6−1) of samples, depending on the current observation length.

5. The device according to claim 2, wherein the estimator and the controlling system are interconnected over a control line on which a control signal is transmitted, indicating after which estimate for the sampling rate ratio ($R_k$) and a phase ($\Phi_k$) a respective observation length has changed.

6. The device according to claim 1, wherein the estimator includes a standardization device for standardizing the estimate for the sampling rate ratio ($R_k$) and a phase ($\Phi_k$) with standardization factors ($9/2N^2$; $3/2N$) which depend on a current observation length.

7. The device according to claim 6, wherein a filter which is connected upstream from the estimator includes a sample converter which omits a number (N/6−1) of samples, depending on the current observation length.

8. The device according to claim 6, wherein the estimator and the controlling system are interconnected over a control line on which a control signal is transmitted, indicating after which estimate for the sampling rate ratio ($R_k$) and the phase ($\Phi_k$) a respective observation length has changed.

9. The device according to claim 1, wherein a filter which is connected upstream from the estimator includes a sample converter which omits a number (N/6−1) of samples, depending on a current observation length.

10. The device according to claim 9, wherein the estimator and the controlling system are interconnected over a control line on which a control signal is transmitted, indicating after which estimate for the sampling rate ratio ($R_k$) and a phase ($\Phi_k$) a respective observation length has changed.

11. The device according to claim 1, wherein the estimator and the controlling system are interconnected over a control line on which a control signal is transmitted, indicating after which estimate for the sampling rate ratio ($R_k$) and a phase ($\Phi_k$) a respective observation length has changed.

12. The device according to claim 11, wherein the estimator estimates the phase ($\Phi_k$) in the middle of each observation interval of the output signal sequence ($S_{out}$) on which the estimate is based, and a first adder is provided in the controlling system to add a phase offset ($N_{old}/2 \cdot R_k$), which corresponds to half a previous observation length, and another phase offset ($N_{old}/m \cdot R_k$), which is larger than a maximum expected deviation ($\Delta\Phi_k$) of the actual phase ($\Phi_{actual,k}$) from the set point phase ($\Phi_{set,k}$).

13. The device according to claim 12, wherein a subtractor and a controller are connected downstream from the first adder, and a control loop is formed by a first multiplier which multiplies output values of the controller by a revised observation length ($N_{new}$), a second adder, a third adder and a time-delay element from the output of the controller to the subtractor.

14. The device according to claim 13, wherein a second multiplier is arranged between the output of the controller and the second adder, which multiplies the output values of the controller by 0 in the case when the observation length is not altered, and in the case when the observation length (N) is doubled, the multiplier multiplies the output values of the controller by $N_{new}/2m$, and in the case when the observation length is reduced by one half, it multiplies the output values of the controller by $N_{old}/2m$.

15. The device according to claim 14, wherein a first switching device which is connected upstream from the second multiplier switches between the multipliers 0, $N_{new}/2m$ and $N_{old}/2m$ and is controlled by the control signal.

16. The device according to claim 12, wherein a second switching device which is provided in the controlling system sends the set point phase ($\Phi_{set,k}$) to a subtractor during a first control period, and during following control periods, it sends the actual phase ($\Phi_{actual,k}$), delayed by one observation interval in a time-delay element, to the subtractor.

17. A method for converting an input digital signal sequence ($S_{in}$) with an input sampling rate ($f_{in}$) into an output digital signal sequence ($S_{out}$) with an output sampling rate ($f_{out}$), comprising:

estimating the sampling rate ratio ($R_k$) between the input sampling rate ($f_{in}$) and the output sampling rate ($f_{out}$) and estimating a set point phase ($\Phi_{set,k}$) of the output signal sequence ($S_{out}$) in observation intervals being variable in observation length;

comparing an actual phase ($\Phi_{actual,k}$) of the output signal sequence ($S_{out}$) with the set point phase ($\Phi_{set,k}$) of the output signal sequence ($S_{out}$);

generating a control signal ($R_{TC,k}$) as a function of the estimated sampling rate ratio ($R_k$) and a deviation ($\Delta\Phi_k$) of the actual phase ($N_{actual,k}$) from the set point phase ($\Phi_{set,k}$); and interpolating the input signal sequence ($S_{in}$) for generating the output signal sequence ($S_{out}$) at sampling times ($t'_1, t'_2, \ldots, t'_6$), the sampling times ($t'_1, t'_2, \ldots, t'_6$) having a position in time being predetermined by the control signal ($R_{TC,k}$).

18. The method according to claim 17, wherein a first register, having a content ($reg_1$) indicating a current observation length, and a second register, having a content ($reg_2$) indicating how often the current observation length is to be increased or decreased by a certain factor, are provided in an observation length controller, and when there is an increase in the current observation length (N), incrementing the content ($reg_1$) of the first register, and decrementing the content ($reg_2$) of the second register.

19. The method according to claim 17, further comprising standardizing the estimate for the sampling rate ratio ($R_k$) and a phase ($\Phi_k$) with standardization factors ($9/2N^2$; $3/2N$) which depend on a current observation length.

* * * * *